US006396672B1

(12) United States Patent
Deam

(10) Patent No.: US 6,396,672 B1
(45) Date of Patent: May 28, 2002

(54) APPARATUS AND METHOD FOR UTILIZING A SNUBBER CAPACITOR TO POWER A SILICON-CONTROLLED RECTIFIER GATE TRIGGER CIRCUIT

(75) Inventor: David R. Deam, San Ramon, CA (US)

(73) Assignee: Electric Power Research Institute, Inc., Palo Alto, CA (US)

( * ) Notice: Subject to any disclaimer, the term of this patent is extended or adjusted under 35 U.S.C. 154(b) by 0 days.

(21) Appl. No.: 09/797,266

(22) Filed: Feb. 28, 2001

Related U.S. Application Data

(60) Provisional application No. 60/186,000, filed on Mar. 1, 2000, provisional application No. 60/186,093, filed on Mar. 1, 2000, and provisional application No. 60/186,094, filed on Mar. 1, 2000.

(51) Int. Cl.[7] .................................................. H02H 3/20
(52) U.S. Cl. ...................................................... 361/91.7
(58) Field of Search ..................... 363/50, 51; 323/901, 323/908, 266; 361/91.7

(56) References Cited

U.S. PATENT DOCUMENTS

| | | | | |
|---|---|---|---|---|
| 4,197,485 A | * | 4/1980 | Nuver | 250/551 |
| 5,013,980 A | * | 5/1991 | Stephens et al. | 315/411 |
| 6,157,551 A | * | 12/2000 | Barak et al. | 363/37 |

* cited by examiner

*Primary Examiner*—Shawn Riley
(74) *Attorney, Agent, or Firm*—Pennie & Edmonds LLP

(57) ABSTRACT

A circuit that includes a silicon-controlled rectifier and a silicon-controlled rectifier gate trigger circuit connected to the silicon-controlled rectifier. A snubber capacitor is connected to the silicon-controlled rectifier and the silicon-controlled rectifier gate trigger circuit. The snubber capacitor generates a snubber capacitor voltage during an off state of the silicon-controlled rectifier. The snubber capacitor voltage thus developed is then used to power the silicon-controlled rectifier gate trigger circuit. The circuit also includes a resister-zener diode circuit connected to the snubber capacitor and an auxiliary capacitor. The auxiliary capacitor is charged through the resister-zener diode circuit by the snubber capacitor voltage. A voltage regulator is connected between the auxiliary capacitor and the silicon-controlled rectifier gate trigger circuit for providing a regulated voltage.

5 Claims, 1 Drawing Sheet

A
R14 33 1W
D8 F50A
D9 SM4007
D10 SM4007
U1 LP2951CM
9.6V
SCR Gate Trigger Circuit
SCR1
G
C
D11 ERZV20D112
C1 100µF 35V
D1 27V UDZ27B
C2 .047µF 50V
R2 6.8M 5%
C3 0.1µF 25V
R1 1M
C4 22µF 25V
R15 125K 10W
C21 0.22µF 1600VDC
B

APPARATUS AND METHOD FOR UTILIZING A SNUBBER CAPACITOR TO POWER A SILICON-CONTROLLED RECTIFIER GATE TRIGGER CIRCUIT

The present application claims the priority of U.S. provisional patent applications bearing Ser. Nos. 60/186,000, 60/186,093, and 60/186,094, all of which were filed on Mar. 1, 2000.

CROSS REFERENCES

The present application is related to the following applications which are incorporated herein by reference: U.S. patent application entitled "LOW POWER GATE TRIGGER CIRCUIT FOR CONTROLLING A SILICON-CONTROLLED RECTIFIER CIRCUIT," application Ser. 09/797,264, and U.S. patent application entitled "APPARATUS AND METHOD FOR ISOLATING A TRIGGER CIRCUIT OF A SILICON-CONTROLLED RECTIFIER," application Ser. No. 09/797,265. All of the above applications are filed simultaneously herewith on Feb. 28, 2001.

BRIEF DESCRIPTION OF THE INVENTION

This invention relates generally to electronic devices used in connection with power supplies. More particularly, this invention relates to a technique for utilizing a snubber capacitor in a power supply trigger circuit.

BACKGROUND OF THE INVENTION

High voltage applications of power electronic switches require that many power electronic devices be in series. Each of these devices must have a gate trigger circuit and this circuit must have voltage isolation. This voltage isolation is typically attained by using transformers with isolated windings.

It would be highly desirable to achieve voltage-isolation without incurring the expense of transformers with isolated windings.

SUMMARY OF THE INVENTION

An embodiment of the present invention is a power electronic switch circuit that includes a silicon-controlled rectifier and a silicon-controlled rectifier gate trigger circuit coupled to the silicon-controlled rectifier. A snubber capacitor is coupled to the silicon-controlled rectifier and the silicon-controlled rectifier gate trigger circuit. The snubber capacitor generates a snubber capacitor voltage during an OFF state of the silicon-controlled rectifier. The snubber capacitor voltage is then used to power the silicon-controlled rectifier gate trigger circuit. The circuit also includes a resister-zener diode circuit coupled to the snubber capacitor and all auxiliary capacitor. The auxiliary capacitor is charged through the resister-zener diode circuit by the snubber capacitor voltage. A voltage regulator is coupled between the auxiliary capacitor and the silicon-controlled rectifier.

In accordance with the invention, the problem of providing a power supply for the gate trigger circuit and the problem of providing voltage isolation are solved by using the snubber capacitor voltage that is developed during the OFF state of the silicon-controlled rectifier. Sufficient charge is collected from the snubber capacitor to power the gate trigger circuit for a few seconds. For the specific application of soft switching a circuit to the ON state when there is a parallel mechanical circuit breaker or circuit closer, this duration of power supply is adequate.

BRIEF DESCRIPTION OF THE DRAWING

For a better understanding of the invention, reference should be made to the following detailed description taken in conjunction with the accompanying drawing, in which.

DETAILED DESCRIPTION OF THE INVENTION

Figure 1:
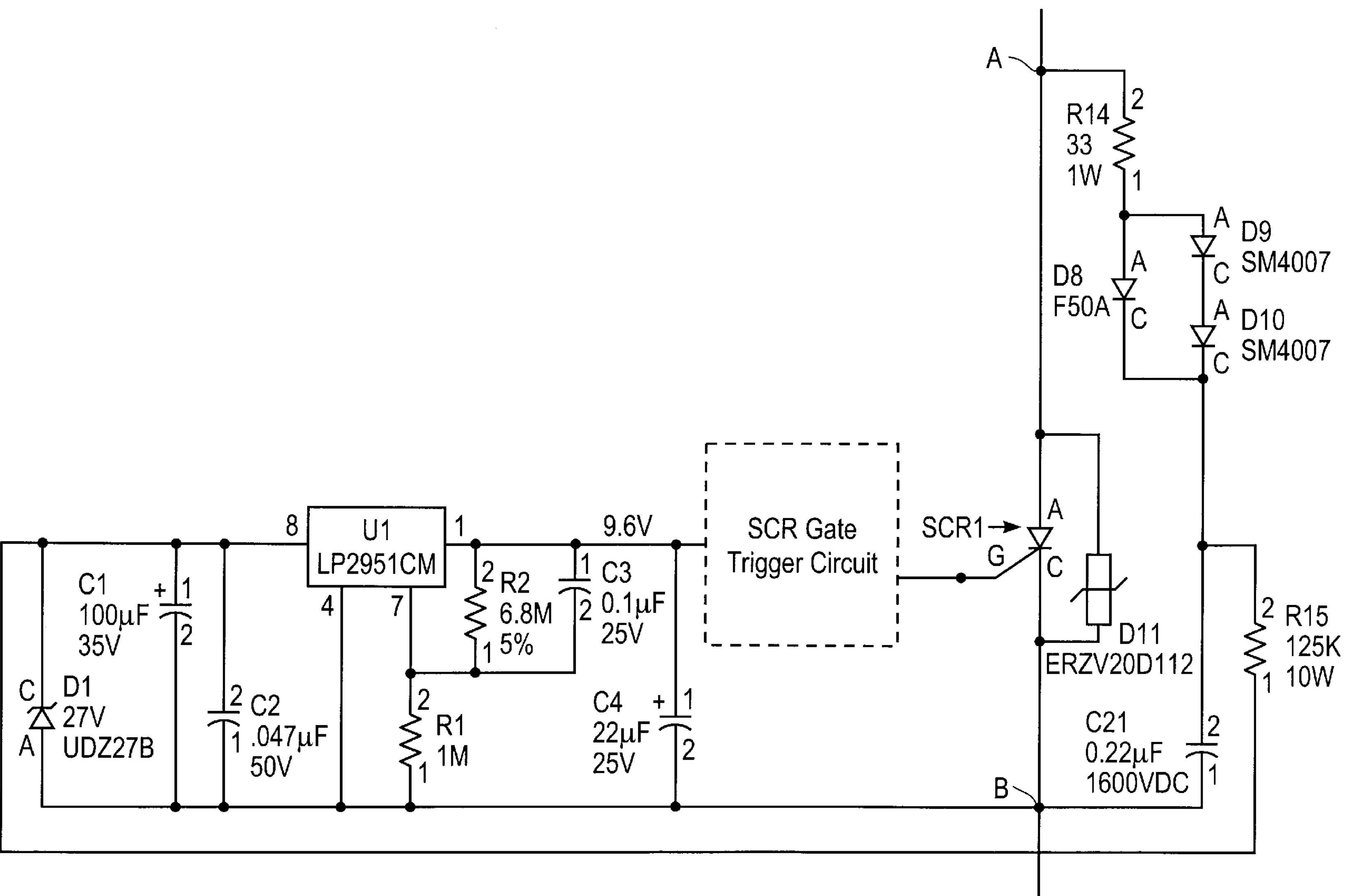
FIG. 1 illustrates snubber capacitor circuit utilized in accordance with an embodiment of the invention.

FIG. 1 illustrates a circuit constructed in accordance with an embodiment of the invention. The circuit may be positioned in series with a set of similarly configured circuits to achieve high voltage blocking capability.

The circuit of FIG. 1 includes a silicon-controlled rectifier (SCR), identified as SCR1. When its gate is not driven, SCR1 is in an OFF state, or non-conducting state. SCR1 is only gated to an ON state (e.g., a conducting state) by the SCR gate trigger circuit for short periods (e.g., a few seconds) to eliminate switching transients until a parallel mechanical circuit breaker (not shown) is closed.

When SCR1 is in an OFF state, capacitor C21 is charged to the design rated blocking voltage of the circuit, assuming there is a potential difference between point A and point B. The voltage on C21 maintains a voltage on C1 through the resister-zener diode circuit of R15 and D1. In the implementation as shown, a voltage of 27 Volts is maintained by the auxiliary capacitor C1.

Voltage regulator U1, using the voltage provided by capacitor C1, provides a regulated voltage for the SCR gate trigger circuit. In the illustrated implementation, a regulated voltage of 9.6 Volts is maintained by the voltage regulator U1. According to the present invention, this regulated voltage can be held for a few seconds until the parallel circuit breaker closes. The voltage on C21 will not recharge until the circuit breaker opens.

By taking advantage of the need to operate the SCR Gate Trigger Circuit only for closing (e.g., triggering SCR1 to the ON state) and only for short periods of time, costly voltage isolation transformers can be eliminated. The circuit of the invention provides transient-free switching.

Because the amount of charges that can be stored by the snubber capacitor and the auxiliary capacitor is limited, it may be desirable to use a SCR gate trigger circuit that does not consume a large amount of power. A low power consumption SCR gate trigger circuit is described in co-pending United States patent application entitled "LOW POWER GATE TRIGGER CIRCUIT FOR CONTROLLING A SILICON-CONTROLLED RECTIFIER CIRCUIT." The SCR gate trigger circuit may receive control signals from driver circuits, which may be electrically isolated from the SCR gate trigger circuit by optical means, as described in co-pending United States patent application entitled "APPARATUS AND METHOD FOR ISOLATING A TRIGGER CIRCUIT OF A SILICON-CONTROLLED RECTIFIER."

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A circuit, comprising:

a silicon-controlled rectifier;

a silicon-controlled rectifier gate trigger circuit coupled to trigger the silicon-controlled rectifier between a conducting state and a non-conducting state; and a snubber capacitor coupled to the silicon-controlled rectifier and the silicon-controlled rectifier gate trigger circuit, wherein the snubber capacitor is charged to a snubber capacitor voltage when the silicon-controlled rectifier is in the non-conducting state, the snubber capacitor voltage for providing power to the silicon-controlled rectifier gate trigger circuit.

2. The circuit of claim 1 further comprising:

a resister-zener diode circuit coupled to the snubber capacitor; and an auxiliary capacitor coupled to the resister zener diode circuit, the auxiliary capacitor being charged through the resister zener diode circuit by the snubber capacitor voltage.

3. The circuit of claim 2 further comprising a voltage regulator coupled between the auxiliary capacitor and the silicon-controlled rectifier.

4. An electronic switch circuit for controlling current flow along a transmission line, comprising:

a silicon-controlled rectifier coupled to the transmission path, the silicon-controlled rectifier having a conducting state and a non-conducting state, wherein the silicon-controlled rectifier permits current flow along the transmission path during the conducting state and wherein the silicon controlled rectifier blocks current flow along the transmission path during the non-conducting state;

a silicon-controlled rectifier gate trigger circuit coupled to trigger the silicon-controlled rectifier between the conducting state and the non-conducting state;

a first capacitor coupled to transmission path and in parallel to the silicon-controlled rectifier, wherein the first capacitor is charged to a first voltage when the silicon-controlled rectifier is in the non-conducting state;

a resister-zener diode circuit coupled to the first capacitor;

a second capacitor coupled to the resister-zener diode circuit, the second capacitor being charged through the resister-zener diode circuit by the first voltage; and a voltage regulator coupled between the second capacitor and the silicon-controlled rectifier, the voltage regulator receiving power from the second capacitor and providing a regulated voltage to the silicon-controlled rectifier gate trigger circuit before the second capacitor completely discharges.

5. The circuit of claim 4, wherein the first capacitor and the second capacitor are configured to provide sufficient power to operate the silicon-controlled rectifier gate trigger circuit for at least a second.

* * * * *